United States Patent
Konno et al.

(10) Patent No.: US 10,084,113 B2
(45) Date of Patent: Sep. 25, 2018

(54) NITRIDE SEMICONDUCTOR TEMPLATE AND LIGHT EMITTING ELEMENT

(71) Applicant: SUMITOMO CHEMICAL COMPANY, LIMITED, Tokyo (JP)

(72) Inventors: Taichiro Konno, Hitachi (JP); Hajime Fujikura, Hitachi (JP); Shusei Nemoto, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/421,171

(22) Filed: Jan. 31, 2017

(65) Prior Publication Data

US 2017/0141269 A1 May 18, 2017

Related U.S. Application Data

(63) Continuation of application No. PCT/JP2014/070636, filed on Aug. 5, 2014.

(51) Int. Cl.
| | |
|---|---|
| H01L 33/32 | (2010.01) |
| H01L 33/12 | (2010.01) |
| H01L 33/00 | (2010.01) |
| H01L 33/18 | (2010.01) |

(52) U.S. Cl.
CPC .......... *H01L 33/32* (2013.01); *H01L 33/0066* (2013.01); *H01L 33/0075* (2013.01); *H01L 33/12* (2013.01); *H01L 33/18* (2013.01)

(58) Field of Classification Search
CPC ..... H01L 33/32; H01L 33/0066; H01L 33/18; H01L 33/12; H01L 33/0075
See application file for complete search history.

(56) References Cited

U.S. PATENT DOCUMENTS

| | | |
|---|---|---|
| 7,875,535 B2 | 1/2011 | Kikkawa et al. |
| 8,193,539 B2 | 6/2012 | Kikkawa et al. |
| 9,105,755 B2 | 8/2015 | Fujikura et al. |
| 9,397,232 B2 | 7/2016 | Fujikura et al. |

(Continued)

FOREIGN PATENT DOCUMENTS

| | | |
|---|---|---|
| JP | 2002-261014 A | 9/2002 |
| JP | 2011-103472 A | 5/2011 |

(Continued)

OTHER PUBLICATIONS

Notification of Transmittal of Translation of the International Preliminary Report on Patentability (PCT/IB/338) in PCT Application No. PCT/JP2014/070636 dated Feb. 16, 2017.

(Continued)

*Primary Examiner* — Michael Carter
*Assistant Examiner* — Mohammed R Alam
(74) *Attorney, Agent, or Firm* — McGinn IP Law Group, PLLC

(57) ABSTRACT

A nitride semiconductor template includes a substrate, an AlN layer that is formed on the substrate and that includes Cl, and a nitride semiconductor layer formed on the AlN layer. In the AlN layer, a concentration of the Cl in a region on a side of the substrate is higher than that in a region on a side of the nitride semiconductor layer. Also, a light-emitting element includes the nitride semiconductor template, and a light-emitting layer formed on the nitride semiconductor template.

18 Claims, 10 Drawing Sheets

(56) References Cited

U.S. PATENT DOCUMENTS

| | | | |
|---|---|---|---|
| 2009/0173951 A1* | 7/2009 | Kikkawa | H01L 21/02378 |
| | | | 257/77 |
| 2011/0073873 A1 | 3/2011 | Kikkawa et al. | |
| 2012/0291698 A1 | 11/2012 | Melnik et al. | |
| 2013/0001644 A1* | 1/2013 | Fujikura | H01L 21/0237 |
| | | | 257/190 |
| 2013/0153858 A1* | 6/2013 | Konno | H01L 29/36 |
| | | | 257/13 |
| 2015/0214308 A1 | 7/2015 | Fujikura et al. | |

FOREIGN PATENT DOCUMENTS

| | | |
|---|---|---|
| JP | 2013-014450 A | 1/2013 |
| JP | 2014-107333 A | 6/2014 |
| WO | WO 2008/012877 A1 | 1/2008 |

OTHER PUBLICATIONS

International Search Report (ISR) (PCT Form PCT/ISA/210), in PCT/JP2014/070636, dated Sep. 2, 2014.
Japanese Office Action dated Jan. 9, 2018 in Japanese Application No. 2016-539724 with an English translation thereof.
Notice from Japanese Patent Office dated Apr. 10, 2018, for the counterpart JP Application No. 2016-539724.
Japanese Office Action dated Jun. 26, 2018, with an English translation.

\* cited by examiner

NITRIDE SEMICONDUCTOR TEMPLATE AND LIGHT EMITTING ELEMENT

TECHNICAL FIELD

The present invention relates to a nitride semiconductor template and a light-emitting element.

BACKGROUND ART

A conventional semiconductor device is known, which has a sapphire substrate, a Cl-containing AlN buffer layer formed on the sapphire substrate, a Cl-free AlN buffer layer formed on the Cl-containing AlN buffer layer, and a Cl-free device constituent layer formed on the Cl-free AlN buffer layer (see, e.g., PTL 1).

In the semiconductor device described in PTL 1, the Cl-containing AlN buffer layer is formed by the Hydride Vapor Phase Epitaxy (HVPE) method using chloride as a raw material and thus contains Cl, while the Cl-free AlN buffer layer is formed by the Metalorganic Chemical Vapor Deposition (MOCVD) method not using chloride as a raw material and thus does not contain Cl.

According to PTL 1, the Cl-free AlN buffer layer formed by the MOCVD method prevents diffusion of Cl from the Cl-containing AlN buffer layer formed by the HVPE method and thus prevents an increase in contact resistance of an ohmic electrode.

The Cl-containing AlN buffer layer described above is formed under specific growth conditions and is thus considered to have uniform Cl concentration distribution.

CITATION LIST

Patent Literature

[PTL 1]

SUMMARY OF INVENTION

Technical Problem

When an AlN layer is formed by the HYPE method, AlCl and $NH_3$ are generally used as source materials. However, AlCl and $NH_3$, which are likely to react with each other in a vapor phase, cause a reaction before reaching the substrate surface and it is thus difficult to grow an AlN layer with sufficient quality on the substrate. In this regard, adjustment of crystal growth conditions, e.g., increasing the flow rates of the source gases, cannot solve such problem.

It is one of objects of the invention to solve the above problems and to provide a nitride semiconductor template in which an AlN layer and a nitride semiconductor layer formed thereon have sufficient quality, as well as a light-emitting element manufactured using the nitride semiconductor template.

Solution to Problem

To achieve the above object, an aspect of the invention provides nitride semiconductor templates described in [1] to [8].

[1] A nitride semiconductor template, comprising: a substrate; an AlN layer that is formed on the substrate and that includes Cl; and a nitride semiconductor layer formed on the AlN layer, wherein in the AlN layer, a concentration of the Cl in a region on a side of the substrate is higher than that in a region on a side of the nitride semiconductor layer.

[2] The nitride semiconductor template defined by [1], wherein the AlN layer comprises a first AlN film, and a second AlN film that is on the first AlN film and that is lower in the concentration of the Cl than the first AlN film.

[3] The nitride semiconductor template defined by [1], wherein the AlN layer comprises a layer that the concentration of the Cl lowers from the side of the substrate to the side of the nitride semiconductor layer.

[4] The nitride semiconductor template defined by any one of [1] to [3], wherein a full width at half maximum of a X-ray rocking curve at a (0004) plane of the nitride semiconductor layer is not more than 300 arcsec, and a full width at half maximum of a X-ray rocking curve at a (10-12) plane thereof is not more than 400 arcsec.

[5] The nitride semiconductor template defined by any one of [1] to [4], wherein the AlN layer has a thickness of not less than 10 nm and not more than 500 nm

[6] The nitride semiconductor template defined by any one of [1] to [5], wherein the substrate comprises a sapphire substrate.

[7] The nitride semiconductor template defined by [6], wherein the substrate comprises a PSS that has a plurality of convex portions formed on a surface.

[8] The nitride semiconductor template defined by any one of [1] to [7], wherein the nitride semiconductor layer comprises a GaN layer.

To achieve the above object, another aspect of the invention provides a light-emitting element in [9] below.

[9] A light-emitting element, comprising: the nitride semiconductor template defined by any one of [1] to [8]; and a light-emitting layer formed on the nitride semiconductor template.

Advantageous Effects of Invention

According to the invention, it is possible to provide a nitride semiconductor template in which an AlN layer and a nitride semiconductor layer formed thereon have sufficient quality, as well as a light-emitting element manufactured using the nitride semiconductor template.

DESCRIPTION OF EMBODIMENTS

First Embodiment

Configuration of Nitride Semiconductor Template

Figure 1A:
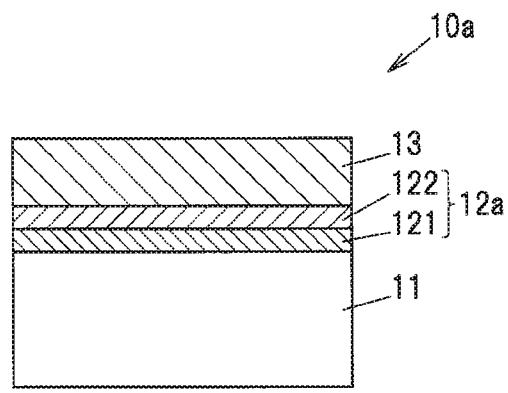
FIG. 1A is a vertical cross-sectional view showing a nitride semiconductor template in a first embodiment.
Figure 1B:
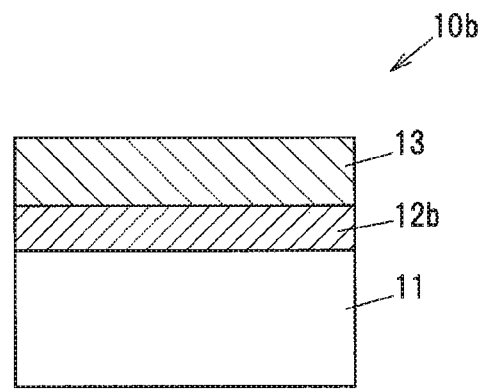
FIG. 1B is a vertical cross-sectional view showing a nitride semiconductor template in the first embodiment.

FIGS. 1A and 1B are vertical cross-sectional views showing nitride semiconductor templates in the first embodiment.

A nitride semiconductor template $10a$ a shown in FIG. 1A has a substrate 11, a Cl-containing AlN layer $12a$ on the substrate 11, and a nitride semiconductor layer 13 formed on the AlN layer $12a$.

A nitride semiconductor template $10b$ shown in FIG. 1B has the substrate 11, a Cl-containing AlN layer $12b$ on the substrate 11, and the nitride semiconductor layer 13 formed on the AlN layer $12b$.

The AlN layer $12a$ of the nitride semiconductor template $10a$ a has a first AlN film 121 and a second AlN film 122 which is formed on the first AlN film 121 and has a lower Cl concentration than the first AlN film 121. Meanwhile, the AlN layer $12b$ of the nitride semiconductor template $10b$ is a layer with a Cl concentration decreasing from the substrate 11 side to the nitride semiconductor layer 13 side. Thus, in both the AlN layer $12a$ and the AlN layer $12b$, the Cl concentration in a region on the substrate 11 side is higher than the Cl concentration in a region on the nitride semiconductor layer 13 side.

The substrate 11 is, e.g., a sapphire substrate. Alternatively, a PSS (Patterned Sapphire Substrate) having plural convex portions formed on a surface may be used as the substrate 11. The height of the convex portion formed on the surface of the PSS is preferably not more than 2.0 μm.

The AlN layer $12a$ and the AlN layer $12b$ are AlN crystal films formed by epitaxial growth using the HYPE method. The function of the AlN layer $12a$ and the AlN layer $12b$ is as a buffer layer between the substrate 11 and the nitride semiconductor layer 13. The HYPE method is a growth technique using a metal chloride gas and an ammonia gas as source materials.

The HYPE method is characterized by a fast crystal growth rate. The crystal growth rate in the HYPE method is not less than 10 μm/h and not more than 300 μm/h, whereas a typical growth rate in, e.g., the metal-organic vapor phase epitaxy (MOVPE) method or the molecular beam epitaxy (MBE) method is several μm/h.

As previously mentioned, when an AlN layer is formed by the HYPE method, AlCl and $NH_3$ are generally used as source materials. However, AlCl and $NH_3$, which are likely to react with each other in a vapor phase, cause a reaction before reaching the substrate surface and it is thus difficult to grow an AlN layer with sufficient quality on the substrate.

As a result of intense study, the present inventors found that such problem when growing an AlN layer by the HYPE method can be solved by supplying a HCl gas simultaneously with the source gases.

However, a high-quality AlN layer is not obtained without any other conditions even if the HCl gas is simultaneously supplied with the source gases. The AlN layer formed at an excessively high flow rate causes an increase in a full width at half maximum (FWHM) of X-ray rocking curve from a nitride semiconductor layer epitaxially grown thereon, i.e., causes a decrease in crystal quality of the nitride semiconductor layer. As a result, the yield of elements formed using a template with such nitride semiconductor layer is decreased. In addition, there is another problem in that a so-called ungrown region with no growth of the nitride semiconductor layer occurs at a peripheral portion of the substrate.

On the other hand, it is possible to prevent such ungrown region when the flow rate of the HCl gas simultaneously supplied with the source gases is reduced, but a too low flow rate causes pits to be formed at the center on the upper surface of the nitride semiconductor layer. As a result, the yield of elements formed using a template with such nitride semiconductor layer is decreased also in this case. In, e.g., a light-emitting element such as LED element, pits cause defects such as a decrease in light emission output or a decrease in resistance to reverse voltage or electrostatic discharge (ESD). Even if initial failure does not occur, the probability of a decrease in reliability significantly increases. Therefore, prevention of pits on the surface of the nitride semiconductor layer 13 is also important.

The AlN layer $12a$ of the nitride semiconductor template $10a$ and the AlN layer $12b$ of the nitride semiconductor template $10b$ in the first embodiment are formed by the HYPE method using the HCl gas simultaneously supplied with the source gases while controlling the flow rate of the HCl gas so as to be high in the early stage of the growth and low in the late stage of the growth. This is because it is possible to prevent pits from occurring on the surface of the nitride semiconductor layer 13 by increasing the flow rate of the HCl gas in the early stage of growth of the AlN layers $12a$ and $12b$, and it is possible to improve crystal quality of the nitride semiconductor layer 13 by reducing the flow rate of the HCl gas in the late stage of the growth.

The higher the flow rate of the HCl gas, the larger the amount of Cl introduced into the AlN layer. Thus, the controlled flow rate results in formation of the AlN layer $12a$ having the first AlN film 121 and the second AlN film 122 with a lower Cl concentration than the first AlN film 121, or formation of the AlN layer $12b$ with a Cl concentration decreasing from the substrate 11 side to the nitride semiconductor layer 13 side.

In detail, as measured by SIMS (Secondary Ion Mass Spectrometry) analysis, the Cl concentration of the AlN layer $12a$ is preferably not less than $1 \times 10^{16}$ and not more than $1 \times 10^{17}$ atoms/cm$^3$ in the first AlN film 121 and not more than $1 \times 10^{16}$ atoms/cm$^3$ in the second AlN film 122, and the Cl concentration of the AlN layer $12b$ is preferably not less than $1 \times 10^{16}$ atoms/cm$^3$ and not more than $1 \times 10^{17}$ atoms/cm³ in a region on the substrate 11 side and not more than $1\times10^{16}$ atoms/cm³ in a region on the nitride semiconductor layer 13 side.

In case of using a PSS as the substrate 11, pits are more likely to be formed on the nitride semiconductor layer 13 than when using a general substrate without convex and concave portions on a surface, and the Cl concentration of the first AlN film 121 of the AlN layer 12a and the AlN layer 12b in the region on the substrate 11 side is therefore preferably higher than when using a general substrate without convex and concave portions on a surface. In other words, the flow rate of the HCl gas in the early stage of growth of the AlN layers 12a and 12b is preferably higher than when using a general substrate without convex and concave portions on a surface.

Meanwhile, the Cl concentration of the second AlN film 122 of the AlN layer 12a and the AlN layer 12b in the region on the nitride semiconductor layer 13 side is greater than zero. The Cl concentration of zero means that the HCl gas is not supplied during formation of these regions. In such a case that the HCl gas is not supplied, however, AlCl reacts with $NH_3$ before reaching the surface of the substrate 11 as previously described and it is not possible to form the AlN layers 12a and 12b with sufficient quality. In addition, a reaction product of AlCl and $NH_3$ may be deposited at a source gas outlet of the HYPE apparatus, resulting in hindering growth of the nitride semiconductor layer 13 and degrading the characteristics thereof. In such a case, especially film thickness uniformity of the nitride semiconductor layer 13 is compromised.

The thickness of the AlN layers 12a and 12b is preferably not less than 10 nm and not more than 500 nm, more preferably, not less than 10 nm and not more than 300 nm. When the thickness is less than 10 nm, formation of pits on the surface of the nitride semiconductor layer 13 may not be sufficiently prevented. On the other hand, when the thickness is more than 500 nm, crystal quality of the nitride semiconductor layer 13 decreases and there is also a problem that growth time increases, resulting in an increase in the manufacturing cost.

The configuration of the AlN layer of the nitride semiconductor template in the first embodiment is not limited to that of the AlN layers 12a and 12b. For example, in the AlN layer 12a, another AlN film may be formed between the first AlN film 121 and the second AlN film 122 so as to have an intermediate Cl concentration, or an AlN film with a Cl concentration gradually or stepwisely decreasing from the first AlN film 121 side to the second AlN film 122 may be formed between the first AlN film 121 and the second AlN film 122.

The nitride semiconductor layer 13 is formed of a nitride semiconductor represented by a composition formula $Al_xIn_yGa_zN$ ($0\leq x\leq 1$, $0\leq y<1$, $0\leq z\leq 1$, $x+y+z=1$), e.g., GaN. The nitride semiconductor layer 13 does not generally contain a dopant.

The nitride semiconductor layer 13 is grown on the AlN layer 12a or 12b and thus has high crystal quality. In detail, the X-ray rocking curve of the nitride semiconductor layer 13 preferably has a full width at half maximum of not more than 300 arcsec for a (0004) plane and a full width at half maximum of not more than 400 arcsec for a (10-12) plane. When the nitride semiconductor layer 13 has such crystal quality that the full width at half maximum of X-ray rocking curve falls within such a range, it is possible to form a device, such as light-emitting element, having excellent characteristics by using the nitride semiconductor template 10a or 10b.

In addition, the nitride semiconductor layer 13 is preferably formed by the HYPE method with a fast crystal growth rate, and is preferably formed at a growth rate of not less than 30 µm/h and not more than 300 µm/h. It is because when the growth rate is less than 30 µm/h, it takes too long to grow a crystal and also crystal quality commensurate with the length of growth time is not expected. Meanwhile, when the growth rate is more than 300 µm/h, it may be difficult to control the condition, such as film thickness, of the nitride semiconductor layer 13.

When, e.g., an epitaxial wafer for LED element is formed using the nitride semiconductor template 10a or 10b and each crystal layer of the epitaxial wafer is grown by the MOVPE method, time required for crystal growth is typically about 6 hours. Since about half of the time is spent growing the nitride semiconductor layer 13, use of the HYPE method with a fast crystal growth rate to grow the nitride semiconductor layer 13 can significantly reduce the epitaxial wafer manufacturing time, resulting in a drastic reduction in the manufacturing cost.

Figure 2A:
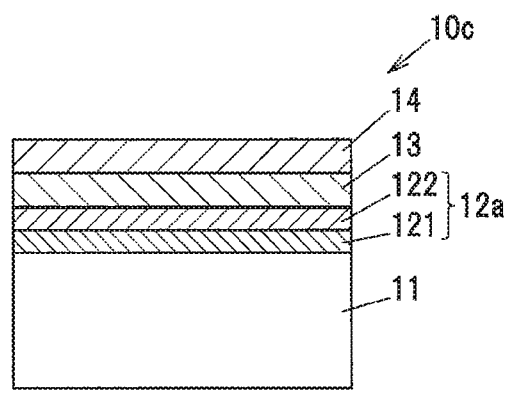
FIG. 2A is a vertical cross-sectional view showing a modification of the nitride semiconductor template in the first embodiment.
Figure 2B:
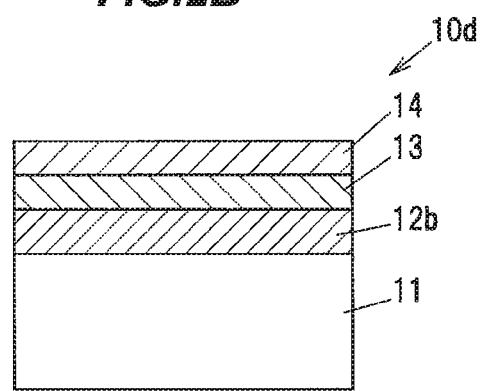
FIG. 2B is a vertical cross-sectional view showing a modification of the nitride semiconductor template in the first embodiment.

FIGS. 2A and 2B are vertical cross-sectional views showing modifications of the nitride semiconductor template in the first embodiment.

Nitride semiconductor templates 10c and 10d shown in FIGS. 2A and 2B are different from the nitride semiconductor templates 10a and 10b shown in FIGS. 1A and 1B in that an n-type nitride semiconductor layer 14 is provided on the nitride semiconductor layer 13.

The nitride semiconductor layer 14 is formed using a nitride semiconductor represented by a composition formula $Al_xIn_yGa_zN$ ($0\leq x<1$, $0\leq y<1$, $0<z\leq 1$, $x+y+z=1$) as a base material and contains a donor, e.g., Si with a concentration of $8\times10^{18}$ atoms/cm³.

To form the nitride semiconductor layer 14, a donor source gas, e.g., dichlorosilane ($SiH_2Cl_2$) gas as a Si source gas is generally introduced in the course of epitaxial growth of a nitride semiconductor crystal which constitutes the undoped nitride semiconductor layer 13. That is, the nitride semiconductor layer 13 is formed of a non-doped nitride semiconductor crystal which is grown before introducing the donor source gas, and the nitride semiconductor layer 14 is formed of an n-type nitride semiconductor crystal which is grown after introducing the donor source gas. In this case, the same growth conditions such as temperature and pressure may be used for the nitride semiconductor layer 13 and the nitride semiconductor layer 14.

The nitride semiconductor layer 14 is grown on the nitride semiconductor layer 13 and is thus as high in crystal quality as the nitride semiconductor layer 13.

In case that the nitride semiconductor layer 14 is provided, the total thickness of the nitride semiconductor layer 13 and the nitride semiconductor layer 14 is the same as the thickness of the nitride semiconductor layer 13 when the nitride semiconductor layer 14 is not provided. In other words, the total thickness of the nitride semiconductor layer 13 and the nitride semiconductor layer 14 in the nitride semiconductor templates 10c and 10d is substantially the same as the thickness of the nitride semiconductor templates 10a and 10b.

Configuration of HYPE Apparatus

Figure 3:
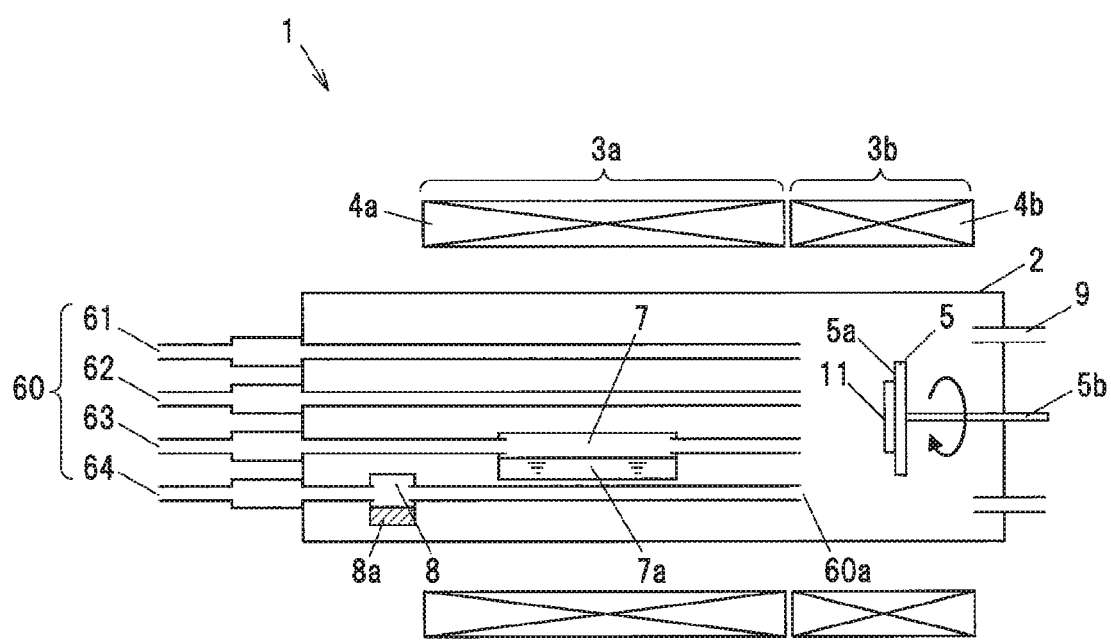
FIG. 3 is a vertical cross-sectional view showing a HYPE apparatus used to manufacture the semiconductor template in the first embodiment.

FIG. 3 is a vertical cross-sectional view showing a HYPE apparatus used to manufacture the semiconductor template in the first embodiment. A HYPE apparatus 1 has a source region 3a for producing source gases of the AlN layers 12a, 12b and the nitride semiconductor layer 13, and a growth region 3b for growing the AlN layers 12a, 12b and the nitride semiconductor layer 13 on the substrate 11 placed therein.

The source region 3a and the growth region 3b are respectively heated to, e.g., about 850° C. and 1100° C. by a heater 4a and a heater 4b. The source region 3a is located upstream of flows of the source gases, etc., and the growth region 3b is located downstream.

The HYPE apparatus 1 also has four gas supply lines 60; a doping line 61, a group V line 62, a group III (Ga) line 63 and a group III (Al) line 64 extending in the source region 3a toward the growth region 3b.

A hydrogen gas, a nitrogen gas or a mixture thereof as a carrier gas is supplied together with a $NH_3$ gas as a nitrogen source from the group V line 62.

A hydrogen gas, a nitrogen gas or a mixture thereof as a carrier gas is supplied together with a HCl gas from the group III line 63. A tank 7 for containing metal gallium (Ga) is located at the middle of the group III line 63, and a Ga melt 7a is contained in the tank 7. A GaCl gas is produced by reaction of the metal Ga with the HCl gas supplied through the group III line 63 and is then sent to the growth region 3b.

A hydrogen gas, a nitrogen gas or a mixture thereof as a carrier gas is supplied together with a HCl gas from the group III line 64. A tank 8 for containing metal aluminum (Al) is located at the middle of the group III line 64, and solid aluminum pellets 8a are contained in the tank 8. An $AlCl_3$ gas is produced by reaction of the metal Al with the HCl gas supplied through the group III line 64 and is then sent to the growth region 3b.

The gases introduced through the doping line 61 are, e.g., a hydrogen-nitrogen mixed gas when growing a non-dopant-containing crystal layer such as undoped GaN layer (un-GaN layer), and are, e.g., a dichlorosilane gas as a Si source (hydrogen dilution, 100 ppm), a HCl gas, a hydrogen gas and a nitrogen gas when growing a dopant-containing crystal layer such as n-type GaN layer. For example, in case that the nitride semiconductor layer 14 is formed, dichlorosilane gas at 20 sccm and HCl gas at 100 sccm are introduced. Meanwhile, during baking which is performed after crystal growth to remove a GaN-based substance attached to the inside of the HYPE apparatus 1, a hydrochloric acid gas, a hydrogen gas and a nitrogen gas are introduced through the doping line 61.

A tray 5 which rotates at a rotational speed of about 3 to 100 r/min is placed in the growth region 3b and the substrate 11 is mounted on a surface 5a (mounting surface) of the tray 5 which faces outlet ports 60a of the gas supply lines 60. Various source gases introduced from the outlet ports 60a react on the surface of the substrate 11, and the MN layers 12a, 12b and the nitride semiconductor layer 13 thereby grow. The source gases, etc., flowing past the substrate 11 are exhausted from the bottom portion through lines 9.

The respective pipes of the gas supply lines 60, the tanks 7, 8 and a rotating shaft 5b of the tray are formed of high purity quartz, and the tray 5 is formed of SiC-coated carbon.

Second Embodiment

The second embodiment is a light-emitting element as an example of element which is formed using the nitride semiconductor template in the first embodiment. The explanation for the same features as the first embodiment, such as the configuration of the nitride semiconductor template, will be omitted or simplified.

Configuration of Epitaxial Wafer

Figure 4A:
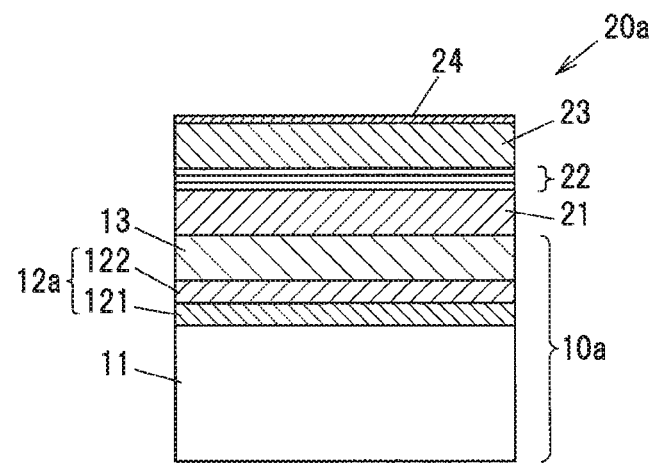
FIG. 4A is a vertical cross-sectional view showing an epitaxial wafer for light-emitting element in a second embodiment.
Figure 4B:
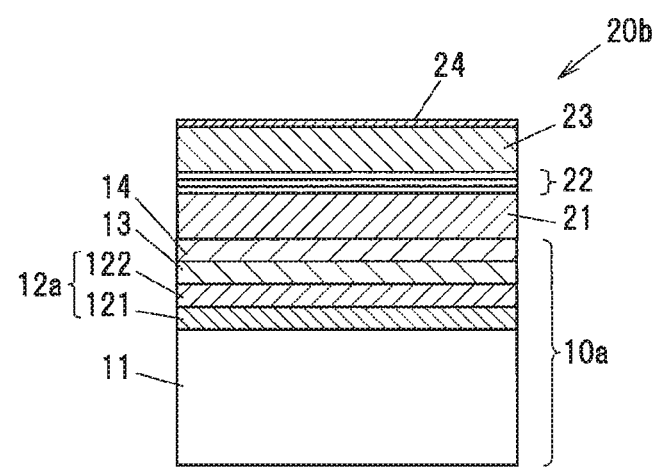
FIG. 4B is a vertical cross-sectional view showing an epitaxial wafer for light-emitting element in the second embodiment.

FIGS. 4A and 4B are vertical cross-sectional views showing epitaxial wafers for light-emitting element in the second embodiment.

An epitaxial wafer 20a is a wafer formed using the nitride semiconductor template 10a in the first embodiment, and an epitaxial wafer 20b is a wafer formed using the nitride semiconductor template 10c in the first embodiment.

The epitaxial wafer 20a has the nitride semiconductor template 10a, an n-type GaN layer 21 formed on the nitride semiconductor template 10a, a multi-quantum well layer 22 as a light-emitting layer formed on the n-type GaN layer 21 and composed of six pairs of InGaN/GaN, a p-type AlGaN layer 23 formed on the multi-quantum well layer 22, and a p-type GaN contact layer 24 formed on the p-type AlGaN layer 23.

The epitaxial wafer 20b is different from the epitaxial wafer 20a in that the nitride semiconductor template 10c is provided in place of the nitride semiconductor template 10a.

The substrate 11 of the epitaxial wafers 20a and 20b is, e.g., a sapphire substrate. Meanwhile, the multi-quantum well layer 22 is, e.g., several hundred nm in total thickness. The p-type AlGaN layer 23 is, e.g., 200 to 500 nm in thickness.

The nitride semiconductor layer 13 of the epitaxial wafer 20a is a thick GaN layer having a thickness of, e.g., about 10 to 15 μm. The nitride semiconductor layer 13 of the epitaxial wafer 20a is formed thick to improve crystal quality, etc.

Meanwhile, the nitride semiconductor layer 13 and the nitride semiconductor layer 14 of the epitaxial wafer 20b are respectively, e.g., an undoped GaN layer and an n-type GaN layer, and the total thickness of the nitride semiconductor layer 13 and the nitride semiconductor layer 14 is about 10 to 15 μm.

Configuration of Light-Emitting Element

Figure 5A:
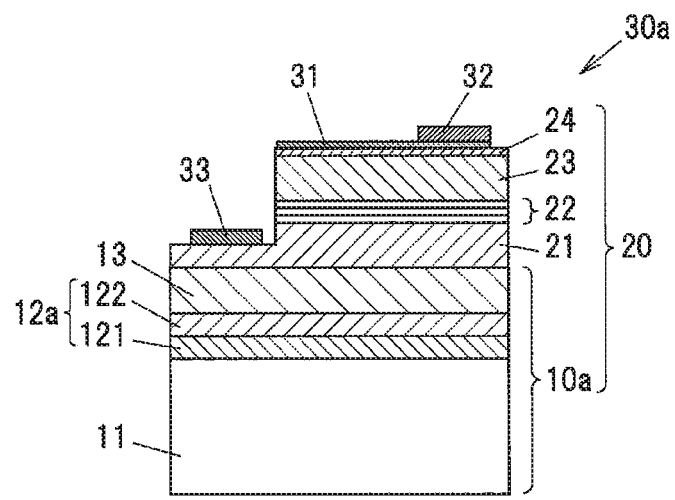
FIG. 5A is a vertical cross-sectional view showing a light-emitting element in the second embodiment.
Figure 5B:
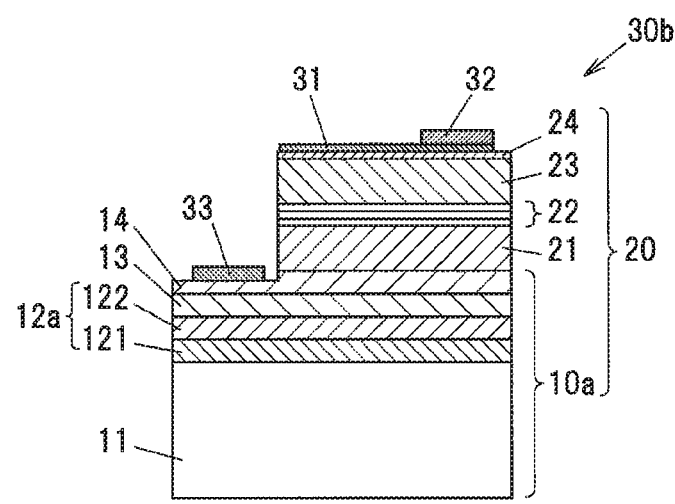
FIG. 5B is a vertical cross-sectional view showing a light-emitting element in the second embodiment.

FIGS. 5A and 5B are vertical cross-sectional views showing light-emitting elements in the second embodiment.

A light-emitting element 30a is an LED element formed using the epitaxial wafer 20a, and a light-emitting element 30b is an LED element formed using the epitaxial wafer 20b.

The light-emitting element 30a has the epitaxial wafer 20a, a Ti/Al electrode 33 formed on a partially exposed region of the n-type GaN layer 21 of the epitaxial wafer 20a, a Ni/Au semi-transparent electrode 31 formed on the p-type GaN contact layer 24, and an electrode pad 32 formed on the Ni/Au semi-transparent electrode 31.

The light-emitting element 30b has the epitaxial wafer 20b, the Ti/Al electrode 33 formed on a partially exposed region of the nitride semiconductor layer 14 of the epitaxial wafer 20b, the Ni/Au semi-transparent electrode 31 formed on the p-type GaN contact layer 24, and the electrode pad 32 formed on the Ni/Au semi-transparent electrode 31.

The n-type GaN layer 21, the multi-quantum well layer 22 and the p-type AlGaN layer 23 are grown on the nitride semiconductor layer 13 or the nitride semiconductor layer 14 having high crystal quality, and thus are as high in crystal quality as the nitride semiconductor layer 13 or the nitride semiconductor layer 14. Thus, the light-emitting elements 30a and 30b can emit high-brightness light.

The light-emitting element 30b is different from the light-emitting element 30a in that the nitride semiconductor layer 14 is provided and the Ti/Al electrode 33 is connected to the nitride semiconductor layer 14, but the characteristics of the light-emitting element 30b is substantially the same as the light-emitting element 30a.

Alternatively, the nitride semiconductor template 10b may be used in the epitaxial wafer 20a and the light-emitting element 30a instead of using the nitride semiconductor template 10a. Likewise, the nitride semiconductor template 10d may be used in the epitaxial wafer 20b and the light-emitting element 30b instead of using the nitride semiconductor template 10c.

Effects of the Embodiments

In the first embodiment, by forming the AlN layer 12a or 12b using the HYPE method while controlling the flow rate of the HCl gas, it is possible to grow a high-quality nitride semiconductor layer 13 thereon and thereby possible to obtain a high-quality nitride semiconductor template 10a, 10b, 10c or 10d.

In the second embodiment, by using such high-quality nitride semiconductor template 10a, 10b, 10c or 10d, it is possible to manufacture the highly reliable, high-brightness light-emitting element 30a or 30b at low cost. It is also possible to use the nitride semiconductor template 10a, 10b, 10c or 10d to manufacture other elements such as transistor, in addition to the light-emitting element.

EXAMPLES

Nitride semiconductor templates and light-emitting elements manufactured according to the embodiments were evaluated. The results will be described below. In the following Examples, the nitride semiconductor templates and the epitaxial wafers for light-emitting element were formed by the HYPE apparatus 1 in the first embodiment.

Example 1

Manufacturing of Nitride Semiconductor Template

In Example 1, a flat-surface sapphire substrate having a thickness of 900 μm and a diameter of 100 mm (4 inches) was used as the substrate 11.

Firstly, the substrate 11 was set on the tray 5 of the HYPE apparatus 1 and air was evacuated from the furnace by supplying pure nitrogen. Then, the substrate was maintained at a temperature of 1100° C. for 10 minutes in a mixed gas of hydrogen at 3 slm and nitrogen at 7 slm.

Next, an AlN crystal film was grown on the substrate 11 for 24 seconds while introducing HCl gas at 50 sccm, hydrogen gas at 2 slm and nitrogen at 1 slm through the group III (Al) line 64, NH$_3$ gas at 50 sccm and hydrogen gas at 1 slm through the group V line 62 and further introducing HCl gas at 400 sccm and nitrogen gas at 2.6 slm through the doping line 61, thereby forming the first AlN film 121.

An AlN crystal film was further grown on the first AlN film 121 for 24 seconds and the second AlN film 122 was thereby formed. The flow rates introduced from the doping line 61 at this time were 20 sccm for the HCl gas and 3 slm for the nitrogen gas. The flow rates of other gases were the same as the conditions for forming the first AlN film 121. As a result, the first AlN film 121 having a thickness of 10 nm and the second AlN film 122 having a thickness of 10 nm were formed, i.e., the AlN layer 12a having a thickness of 20 nm was obtained.

Next, an undoped GaN crystal film was grown on the AlN layer 12a at a growth rate of 60 μm/h (1 μm/min) for 5 minutes while introducing HCl gas at 100 sccm, hydrogen gas at 2 slm and nitrogen at 1 slm through the group III (Ga) line 63 and NH$_3$ gas at 2 slm and hydrogen gas at 1 slm through the group V line 62, thereby forming a 5 μm-thick undoped GaN layer as the nitride semiconductor layer 13. The nitride semiconductor template 10a was obtained through these steps.

Next, the substrate temperature was lowered to around room temperature while supplying NH$_3$ gas at 2 slm and nitrogen at 8 slm. Then, atmosphere in the furnace of the HYPE apparatus 1 was changed to nitrogen by performing nitrogen purge for several tens minutes, and the nitride semiconductor template 10a was subsequently taken out of the HYPE apparatus 1.

In Example 1, the AlN layer 12a and the nitride semiconductor layer 13 were formed under normal pressure (1 atm) throughout the crystal growth.

Evaluation of Nitride Semiconductor Template

The nitride semiconductor template 10a obtained through the above-described process was inspected by a surface inspection system. The inspection range on the nitride semiconductor template 10a was an area excluding a 1 mm-wide peripheral portion. As a result of the inspection, the number of pits having a size of not less than 1 μm was zero. Pits were not found also by surface observation under an optical microscope.

Next, a full width at half maximum of X-ray rocking curve from a (0004) plane of the nitride semiconductor layer 13 was measured to evaluate crystal quality of the nitride semiconductor layer 13 of the nitride semiconductor template 10a, and the value was 220 arcsec. A full width at half maximum of X-ray rocking curve from a (10-12) plane was also measured, and the value was 291 arcsec.

The evaluation described above was also conducted on nine other nitride semiconductor templates 10a. As a result, 1 to 3 pits were observed on two of the ten nitride semiconductor templates 10a, and pits were not observed on the other eight templates. In addition, variation in the full width at half maximum of X-ray rocking curve among the ten nitride semiconductor templates 10a was within ±10 arcsec.

Figure 6:
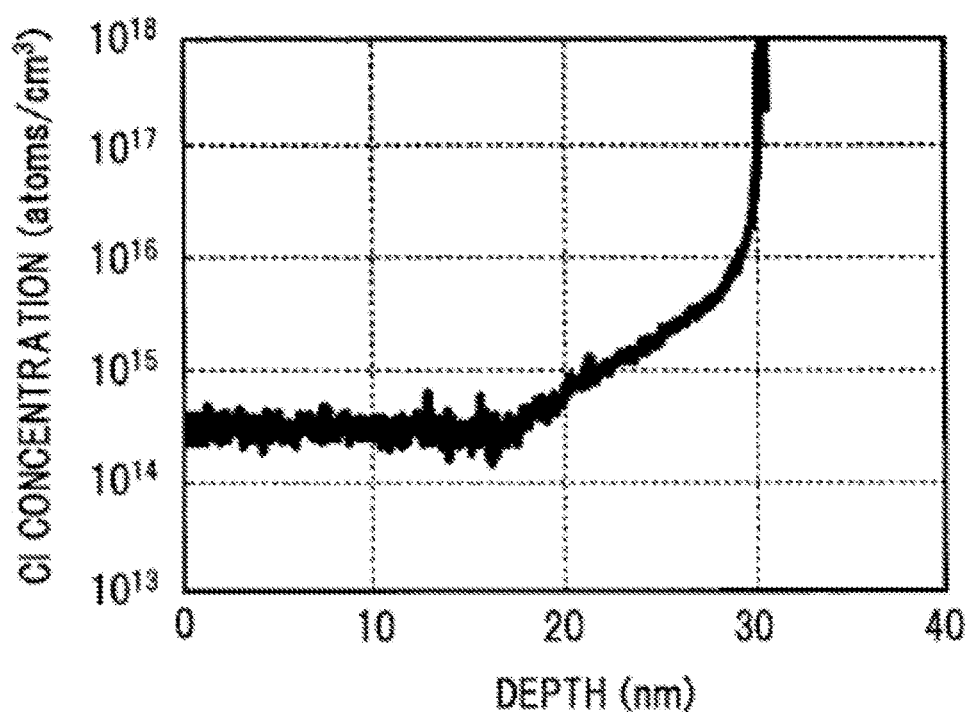
FIG. 6 is a graph showing the Cl concentration of the nitride semiconductor template in Example 1 obtained by SIMS analysis.

FIG. 6 is a graph showing the Cl concentration of the nitride semiconductor template 10a in Example 1 obtained by SIMS analysis. A position at a depth of about 5 μm from the surface of the nitride semiconductor template 10a is the origin (0 nm) of the horizontal axis in FIG. 6. A region deeper than 30 nm is a region of the substrate 11 (sapphire substrate), a region at a depth of 20 to 30 nm is a region of the first AlN film 121, and a region at a depth of 10 to 20 nm is a region of the second AlN film 122.

As shown in FIG. 6, the Cl concentration in the region of the first AlN film 121 is lower than the Cl concentration in the region of the second AlN film 122.

Manufacturing of Light-Emitting Element

Next, the n-type GaN layer 21, the multi-quantum well layer 22, the p-type AlGaN layer 23 and the p-type GaN contact layer 24 were grown on the obtained nitride semiconductor template 10a by the MOVPE method, thereby forming the epitaxial wafer 20a. After that, the temperature of the growth furnace was lowered to around room temperature and the epitaxial wafer 20a was taken out of a MOVPE apparatus.

Next, the surface of the obtained epitaxial wafer 20a was partially removed by RIE (Reactive Ion Etching) to expose a portion of the n-type GaN layer 21 and the Ti/Al electrode 33 was then formed on the exposed portion. After that, the Ni/Au semi-transparent electrode 31 and the electrode pad 32 were formed on the p-type GaN contact layer 24, thereby obtaining a blue LED as the light-emitting element 30a.

Evaluation of Light-Emitting Element 20 mA current was supplied to the obtained light-emitting element 30a and emission characteristics thereof were evaluated. The emission peak wavelength was about 450 nm, forward voltage was 3.25V and emission output of 30 mW was achieved. Reliability of the light-emitting element 30a was also evaluated by a power-on test in which 50 mA current is supplied at room temperature for 1000 hours. The relative output was 98%, which shows that reliability of the light-emitting element 30a is sufficiently high. The relative output here is a value obtained by dividing light emission output after 1000-hour power supply by light emission output at the start of the test and then multiplying by 100.

In Example 1, it was confirmed that the nitride semiconductor template 10a and the light-emitting element 30a having the same quality were obtained even when the growth rate of the nitride semiconductor layer 13 was increased to 300 μm/h.

Example 2

Manufacturing of Nitride Semiconductor Template

The nitride semiconductor template 10b was formed in Example 2. The conditions for forming the layers other than the MN layer are the same as for those of the nitride semiconductor template 10a in Example 1 and the detailed description thereof will be omitted.

Firstly, the substrate 11 was set on the tray 5 of the HYPE apparatus 1 and air was evacuated from the furnace by supplying pure nitrogen. Then, the substrate was maintained at a temperature of 1100° C. for 10 minutes in a mixed gas of hydrogen at 3 slm and nitrogen at 7 slm.

Next, growth of an AlN crystal film on the substrate 11 was initiated by introducing HCl gas at 50 sccm, hydrogen gas at 2 slm and nitrogen at 1 slm through the group III (Al) line 64, NH$_3$ gas at 50 sccm and hydrogen gas at 1 slm through the group V line 62 and further introducing HCl gas at 400 sccm and nitrogen gas at 2.6 slm through the doping line 61.

Then, the AlN crystal film was continuously grown while gradually reducing the flow rate of the HCl gas through the doping line 61 from 400 sccm (the initial flow rate) to 20 sccm (the ending flow rate), thereby forming a 10 nm-thick AlN layer 12b.

After that, the nitride semiconductor layer 13 was formed on the AlN layer 12b and the nitride semiconductor template 10b was thereby obtained.

Evaluation of Nitride Semiconductor Template

The surface of the nitride semiconductor template 10b obtained through the above-described process was inspected by the same method as in Example 1. As a result of the inspection, the number of pits having a size of not less than 1 μm was zero. Pits were not found also by surface observation under an optical microscope.

Next, values of the full width at half maximum of X-ray rocking curve from a (0004) plane and a (10-12) plane of the nitride semiconductor layer 13 were measured to evaluate crystal quality of the nitride semiconductor layer 13 of the nitride semiconductor template 10b, and the values were similar to those of the nitride semiconductor template 10a in Example 1.

Manufacturing of Light-Emitting Element

Next, using the obtained nitride semiconductor template 10b, the light-emitting element 30a was formed by the same process as in Example 1. Crystal growth on the nitride semiconductor template 10b was performed simultaneously with crystal growth on the nitride semiconductor template 10a in Example 1.

Evaluation of Light-Emitting Element

Emission characteristics and reliability of the obtained light-emitting element 30a were evaluated in the same manner as Example 1. Excellent results equivalent to Example 1 were obtained.

Example 3

Manufacturing of Nitride Semiconductor Template

The nitride semiconductor template 10a in Example 3 was formed so that the thickness of the second AlN film 122 is different from that in Example 1. The conditions other than the thickness of the second AlN film 122 are the same as those for the nitride semiconductor template 10a in Example 1 and the detailed description thereof will be omitted.

The flow rate of each gas introduced during growth of the second AlN film 122 is the same as Example 1 and growth time was varied so that the second AlN film 122 has a different thickness. Then, three types of nitride semiconductor templates 10a respectively having the 300 nm-thick, 500 nm-thick and 700 nm-thick the second AlN films 122 were formed.

Evaluation of Nitride Semiconductor Template

The nitride semiconductor template 10a having the 300 nm-thick second AlN film 122 was subjected to measurement of the full width at half maximum of X-ray rocking curve from a (10-12) plane of the nitride semiconductor layer 13, and the obtained full width at half maximum was about 15 arcsec larger than Example 1.

Meanwhile, the nitride semiconductor template 10a having the 500 nm-thick second AlN film 122 was subjected to measurement of the full width at half maximum of X-ray rocking curve from a (10-12) plane of the nitride semiconductor layer 13, and the obtained full width at half maximum was about 20 arcsec larger than Example 1.

The nitride semiconductor template 10a having the 700 nm-thick second AlN film 122 was also subjected to measurement of the full width at half maximum of X-ray rocking curve from a (10-12) plane of the nitride semiconductor layer 13, and the obtained full width at half maximum was about 60 arcsec larger than Example 1.

Manufacturing of Light-Emitting Element

Next, using the three types of nitride semiconductor templates 10a, the light-emitting elements 30a were formed by the same process as in Example 1.

Evaluation of Light-Emitting Element

Emission characteristics and reliability of the obtained light-emitting elements 30a were evaluated in the same manner as Example 1. Excellent results equivalent to Example 1 were obtained from the light-emitting element 30a formed using the nitride semiconductor template 10a having the 300 nm-thick second AlN film 122 and the light-emitting element 30a formed using the nitride semiconductor template 10a having the 500 nm-thick second AlN film 122.

On the other hand, the light-emitting element 30a formed using the nitride semiconductor template 10a having the 700 nm-thick second AlN film 122 resulted in having characteristics inferior to the light-emitting element 30a in Example 1.

Example 4

Manufacturing of Nitride Semiconductor Template

When forming the nitride semiconductor template 10a in Example 4, the flow rate of the HCl gas introduced through the doping line 61 during growth of the second AlN film 122 was changed from that in Example 1. The conditions for forming the layers other than the second AlN film 122 and the flow rates of the gases introduced through the doping line 61 except the HCl gas are the same as in Example 1 and the detailed description thereof will be omitted.

In Example 4, the flow rate of the HCl gas introduced through the doping line 61 during growth of the second AlN film 122 was varied to form seven types of nitride semiconductor templates 10a. The flow rate of the HCl gas introduced through the doping line 61 during growth of the second AlN film 122 was 50 sccm, 75 sccm, 100 sccm, 200 sccm, 300 sccm, 400 sccm and 500 sccm respectively for the seven types of nitride semiconductor templates 10a.

Evaluation of Nitride Semiconductor Template

The seven types of nitride semiconductor templates 10a obtained through the above-described process were subjected to measurement of the full width at half maximum of X-ray rocking curve from a (0004) plane and a (10-12) plane of the nitride semiconductor layer 13.

Figure 7:
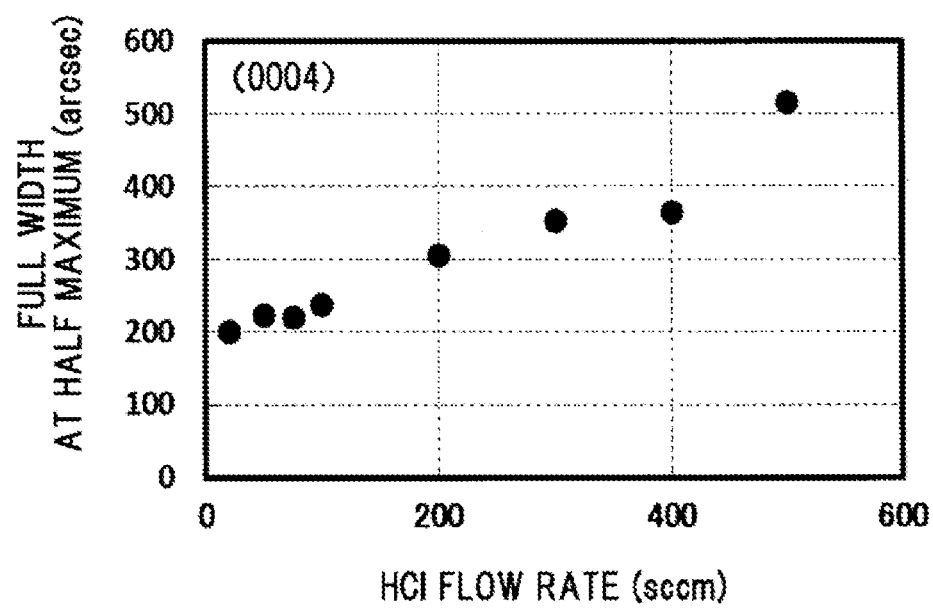
FIG. 7 is a graph showing a relation between a flow rate of HCl gas introduced through a doping line during growth of a second AlN film and a full width at half maximum of X-ray rocking curve from a (0004) plane of a nitride semiconductor layer in Example 4.
Figure 8:
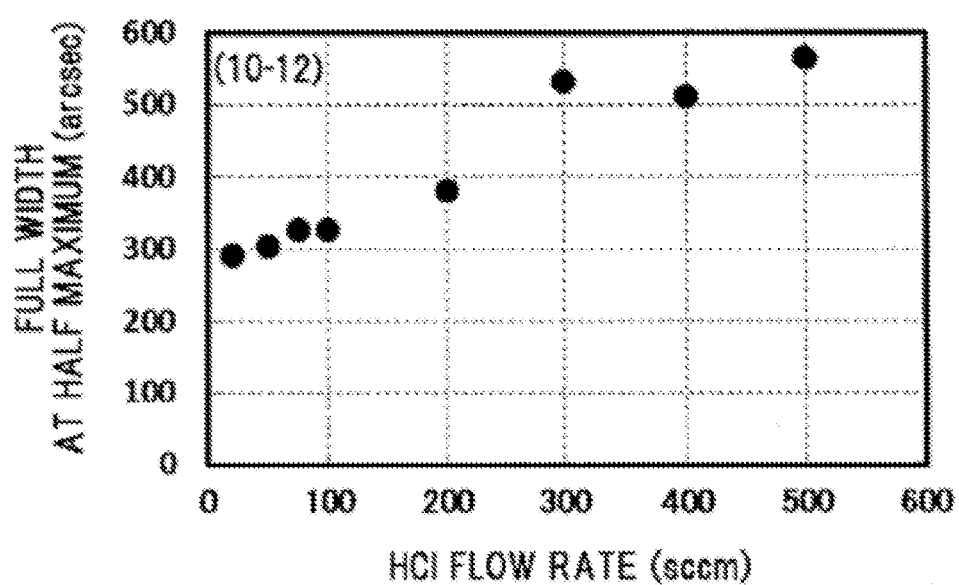
FIG. 8 is a graph showing a relation between a flow rate of HCl gas introduced through a doping line during growth of the second AlN film and a full width at half maximum of X-ray rocking curve from a (10-12) plane of the nitride semiconductor layer in Example 4.

The evaluation results are shown in Table 1 below and FIGS. 7 and 8. FIG. 7 is a graph showing a relation between the flow rate of the HCl gas introduced through the doping line 61 during growth of the second AlN film 122 and a full width at half maximum of X-ray rocking curve from a (0004) plane of the nitride semiconductor layer 13. FIG. 8 is a graph showing a relation between the flow rate of the HCl gas introduced through the doping line 61 during growth of the second AlN film 122 and a full width at half maximum of X-ray rocking curve from a (10-12) plane of the nitride semiconductor layer 13.

In Table 1 and FIGS. 7 and 8, the values when the flow rate of the HCl gas introduced from the doping line 61 during growth of the second AlN film 122 is 20 sccm are obtained from the nitride semiconductor template 10a in Example 1.

TABLE 1

| HCl flow rate [sccm] | (0004) FWHW [arcsec] | (10-12) FWHW [arcsec] |
|---|---|---|
| 20 | 220 | 291 |
| 50 | 223 | 304 |
| 75 | 220 | 327 |
| 100 | 237 | 327 |
| 200 | 305 | 382 |

TABLE 1-continued

| HCl flow rate [sccm] | (0004) FWHW [arcsec] | (10-12) FWHW [arcsec] |
|---|---|---|
| 300 | 351 | 531 |
| 400 | 363 | 511 |
| 500 | 514 | 563 |

As shown in Table 1 and FIGS. 7 and 8, when the flow rate of the HCl gas introduced through the doping line 61 during growth of the second AlN film 122 is increased toward 400 sccm which is the flow rate of the HCl gas introduced through the doping line 61 during growth of the first AlN film 121, the full width at half maximum increases, i.e., crystal quality of the nitride semiconductor layer 13 decreases.

Comparative Example

Manufacturing of Nitride Semiconductor Template

Figure 9:
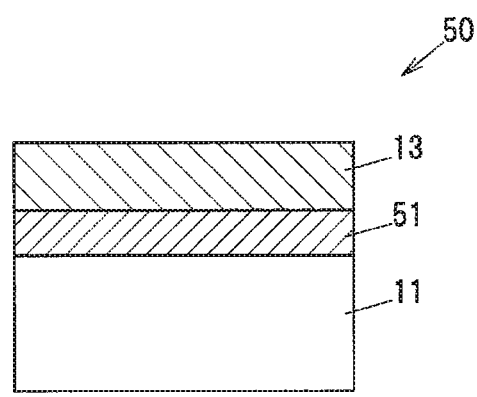
FIG. 9 is a vertical cross-sectional view showing a nitride semiconductor template in Comparative Example.

A nitride semiconductor template 50 shown in FIG. 9 was made as Comparative Example. An AlN layer 51 of the nitride semiconductor template 50 is 20 nm which is the same as the AlN layer 12a in Example 1. The conditions for forming the layers other than the AlN layer are the same as for those of the nitride semiconductor template 10a in Example 1 and the detailed description thereof will be omitted.

In Comparative Example, the flow rate of the HCl gas introduced through the doping line 61 during growth of the AlN layer 51 was varied to form eight types of nitride semiconductor templates 50. The flow rates of other gases are the same as those for the first AlN film 121 in Example 1. The flow rate of the HCl gas introduced through the doping line 61 during growth of the AlN layer 51 was 20 sccm, 50 sccm, 75 sccm, 100 sccm, 200 sccm, 300 sccm, 400 sccm and 500 sccm respectively for the eight nitride semiconductor templates 50.

Figure 10:
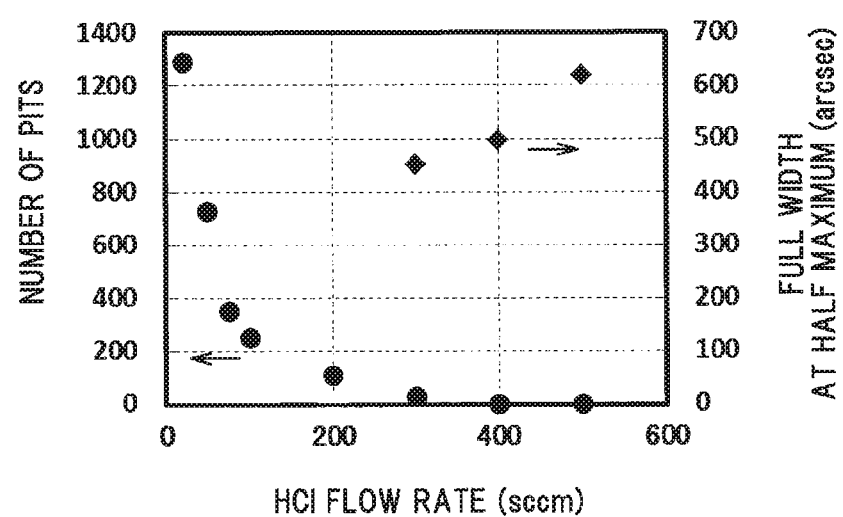
FIG. 10 is a graph showing a relation between a flow rate of HCl gas introduced through a doping line during growth of the second AlN film, a full width at half maximum of X-ray rocking curve from a (0004) plane of the nitride semiconductor layer and the number of pits on the surface of the nitride semiconductor layer.

The surfaces of the eight types of nitride semiconductor templates 50 obtained through the above-described process were inspected by the same method as in Example 1. A full width at half maximum of X-ray rocking curve from a (0004) plane of the nitride semiconductor layer 13 was also measured. The evaluation results are shown in Table 2 below and FIG. 10. FIG. 10 is a graph showing a relation between the flow rate of the HCl gas introduced through the doping line 61 during growth of the second AlN film 122, a full width at half maximum of X-ray rocking curve from a (0004) plane of the nitride semiconductor layer 13 and the number of pits on the surface of the nitride semiconductor layer 13.

TABLE 2

| HCl flow rate [sccm] | Number of pits | (0004) FWHW [arcsec] |
|---|---|---|
| 20 | 1289 | Not Evaluated |
| 50 | 725 | Not Evaluated |
| 75 | 351 | Not Evaluated |
| 100 | 252 | Not Evaluated |
| 200 | 108 | Not Evaluated |
| 300 | 29 | 451 |
| 400 | 0 | 496 |
| 500 | 0 | 620 |

As shown in Table 2 and FIG. 10, when the flow rate of the HCl gas introduced through the doping line 61 during growth of the AlN layer 51 was not more than 200 sccm, many pits (surface defects) were formed on the surface of the nitride semiconductor layer 13 and the nitride semiconductor templates were in an unusable state.

When the flow rate of the HCl gas introduced through the doping line 61 during growth of the AlN layer 51 was not less than 400 sccm, the number of pits was zero but an ungrown region with no growth of the nitride semiconductor layer 13 occurred at a peripheral portion of the nitride semiconductor templates 50.

When the flow rate of the HCl gas introduced through the doping line 61 during growth of the AlN layer 51 was 300 sccm, the ungrown region with no growth of the nitride semiconductor layer 13 did not occur but pits were present and also the full width at half maximum of X-ray rocking curve from a (0004) plane was as large as 451 arcsec, which means that a high-quality nitride semiconductor layer 13 was not obtained.

Manufacturing of Light-Emitting Element

Next, using the obtained eight types of nitride semiconductor templates 50, light-emitting elements were formed by the same process as in Example 1. Crystal growth on the nitride semiconductor template 50 was performed simultaneously with crystal growth on the nitride semiconductor template 10a in Example 1.

Evaluation of Light-Emitting Element

Emission characteristics and reliability of the obtained light-emitting elements were evaluated in the same manner as Example 1, but good results were not obtained from any of the light-emitting elements.

Although the embodiments and examples of the invention have been described, the invention is not intended to be limited to the embodiments and example, and the various kinds of modifications can be implemented without departing from the gist of the invention.

In addition, the invention according to claims is not to be limited to the above-mentioned embodiments and example. Further, please note that all combinations of the features described in the embodiments and example are not necessary to solve the problem of the invention.

INDUSTRIAL APPLICABILITY

A nitride semiconductor template, in which an AlN layer and a nitride semiconductor layer formed thereon have sufficient quality, is provided.

REFERENCE SIGNS LIST 10a, 10b, 10c, 10d NITRIDE SEMICONDUCTOR TEMPLATE
11 SUBSTRATE
12a, 12b AlN LAYER
121 FIRST AlN FILM
122 SECOND AlN FILM
13, 14 NITRIDE SEMICONDUCTOR LAYER
30a, 30b LIGHT-EMITTING ELEMENT

The invention claimed is:

1. A nitride semiconductor template, comprising:
a substrate;
an AlN layer that is formed on the substrate and that includes Cl in every region of the AlN layer; and
a nitride semiconductor layer formed on the AlN layer,
wherein in the AlN layer, a concentration of the Cl in a region on a side of the substrate is higher than that in a region on a side of the nitride semiconductor layer.

2. The nitride semiconductor template according to claim 1, wherein the AlN layer comprises a first AlN film, and a second AlN film that is on the first AlN film and that is lower in the concentration of the Cl than the first AlN film.

3. The nitride semiconductor template according to claim 1, wherein the AlN layer comprises a layer that the concentration of the Cl lowers from the side of the substrate to the side of the nitride semiconductor layer.

4. The nitride semiconductor template according to claim 1, wherein a full width at half maximum of an X-ray rocking curve at a (0004) plane of the nitride semiconductor layer is not more than 300 arcsec, and a full width at half maximum of a X-ray rocking curve at a (10-12) plane thereof is not more than 400 arcsec.

5. The nitride semiconductor template according to claim 1, wherein the AlN layer has a thickness of not less than 10 nm and not more than 500 nm.

6. The nitride semiconductor template according to claim 1, wherein the substrate comprises a sapphire substrate.

7. The nitride semiconductor template according to claim 6, wherein the substrate comprises a patterned sapphire substrate (PSS) substrate that has a plurality of convex portions formed on a surface.

8. The nitride semiconductor template according to claim 1, wherein the nitride semiconductor layer comprises a GaN layer.

9. A light-emitting element, comprising:
the nitride semiconductor template according to claim 1; and
a light-emitting layer formed on the nitride semiconductor template.

10. The nitride semiconductor template according to claim 1, wherein the Cl concentration of the AlN layer is not less than $1 \times 10^{16}$ atoms/cm$^3$ and not more than $1 \times 10^{17}$ atoms/cm$^3$ in the region on the side of the substrate.

11. The nitride semiconductor template according to claim 1, wherein the Cl concentration of the AlN layer is not more than $1 \times 10^{16}$ atoms/cm$^3$ in the region on the side of the nitride semiconductor layer.

12. The nitride semiconductor template according to claim 1, further comprising:
an n-type nitride semiconductor layer formed on the nitride semiconductor layer.

13. The nitride semiconductor template according to claim 12, wherein the n-type nitride semiconductor layer comprises $Al_xIn_yGa_zN$ ($0 \leq x < 1$, $0 \leq y < 1$, $0 < z \leq 1$, $x+y+z=1$).

14. A nitride semiconductor template, comprising:
a substrate;
an AlN layer that is formed on the substrate and that includes Cl in every region of the AlN layer;
a nitride semiconductor layer formed on the AlN layer; and
an n-type nitride semiconductor layer formed on the nitride semiconductor layer and comprising $Al_xIn_yGa_zN$ ($0 \leq x < 1$, $0 \leq y < 1$, $0 < z \leq 1$, $x+y+z=1$),
wherein in the AlN layer, a concentration of the Cl decreases in a direction away from the substrate and toward the nitride semiconductor layer, such that the concentration of the Cl at a side of the AlN layer facing the substrate is greater than the concentration of the Cl at a side of the AlN layer facing the nitride semiconductor layer, and
wherein the Cl concentration of the AlN layer at the side of AlN layer facing the substrate is not less than $1 \times 10^{16}$ atoms/cm$^3$ and not more than $1\times10^{17}$ atoms/cm$^3$, and the Cl concentration of the AlN layer at the side of the AlN layer facing the nitride semiconductor layer is not more than $1\times10^{16}$ atoms/cm$^3$.

15. A method of forming a nitride semiconductor template, the method comprising:
   forming an AlN layer on the substrate, the AlN layer including Cl in every region of the AlN layer; and
   forming a nitride semiconductor layer on the AlN layer,
   wherein in the AlN layer, a concentration of the Cl in a region on a side of the substrate is greater than that in a region on a side of the nitride semiconductor layer.

16. The method of forming the nitride semiconductor template according to claim 15, wherein the forming of the AlN layer comprises forming an AlN crystal film by epitaxial growth using hydride vapor phase epitaxy (HVPE).

17. The method of forming the nitride semiconductor template according to claim 15, wherein the forming of the AlN layer comprises using AlCl and NH$_3$ as source materials in a hydride vapor phase epitaxy (HVPE) apparatus.

18. The method of forming the nitride semiconductor template according to claim 15, wherein the forming of the AlN layer comprises:
   supplying HCl gas simultaneously with source gases; and
   controlling a flow rate of the supplied HCl gas so as to be greater in an early stage of growth of the AlN layer, than in a later stage of the growth of the AlN layer.

\* \* \* \* \*